United States Patent
Steinberg

[11] Patent Number: 5,841,485
[45] Date of Patent: Nov. 24, 1998

[54] VIDEO SIGNAL PROCESSING AND PROCESSOR TAKING RATIO OF INTERMEDIATE FILTERED SIGNALS

[75] Inventor: Avigdor Steinberg, Hampshire, Great Britain

[73] Assignee: Snell & Wilcox Limited, Hampshire, England

[21] Appl. No.: 648,826

[22] PCT Filed: Jun. 10, 1993

[86] PCT No.: PCT/GB93/01236

§ 371 Date: Feb. 21, 1995

§ 102(e) Date: Feb. 21, 1995

[87] PCT Pub. No.: WO94/01932

PCT Pub. Date: Jan. 20, 1994

Related U.S. Application Data

[63] Continuation of Ser. No. 360,712, Feb. 21, 1996.

[30] Foreign Application Priority Data

Jul. 3, 1992 [GB] United Kingdom .................. 9214214

[51] Int. Cl.[6] ........................................... H04N 9/77
[52] U.S. Cl. ........................ 348/663; 348/571; 348/708
[58] Field of Search .................... 348/663, 664, 348/665, 521, 704, 912, 708, 711, 624, 609

[56] References Cited

U.S. PATENT DOCUMENTS

| | | | |
|---|---|---|---|
| 3,965,288 | 6/1976 | Yamada et al. .................. 455/192.3 |
| 4,183,051 | 1/1980 | Richman .................. 348/631 |
| 4,322,641 | 3/1982 | Packard . | |
| 4,825,297 | 4/1989 | Fuchsberger et al. .................. 348/606 |
| 4,839,727 | 6/1989 | Tanaka et al. .................. 348/663 |
| 4,947,243 | 8/1990 | Wendland et al. .................. 348/609 |
| 5,047,866 | 9/1991 | Watanabe et al. .................. 348/665 |
| 5,161,006 | 11/1992 | Monta et al. .................. 348/663 |
| 5,262,847 | 11/1993 | Rodriguez et al. .................. 348/571 |
| 5,333,014 | 7/1994 | Drewery et al. .................. 348/663 |
| 5,416,531 | 5/1995 | Gai .................. 348/663 |
| 5,430,497 | 7/1995 | Strolle et al. .................. 348/571 |

OTHER PUBLICATIONS

"High Word-Rate Digital Filters With Programmable Look-Up", H. Schroder, IEEE Transactions on Circuits and Systems, vol. 24, No. 5, May 1977, pp. 277-279.

*Primary Examiner*—Victor R. Kostak
*Attorney, Agent, or Firm*—Lowe, Price, LeBlanc & Becker

[57] ABSTRACT

A signal processor for extracting chrominance information from a composite video signal has transversal filters developing first and second signals (A and B). A look-up table generates a control signal (C) which is a non-linear function of the ratio A/B and simultaneously develops the product B*C. A filter of this form can combine steep frequency response with minimal degradation of the response to pulses.

12 Claims, 9 Drawing Sheets

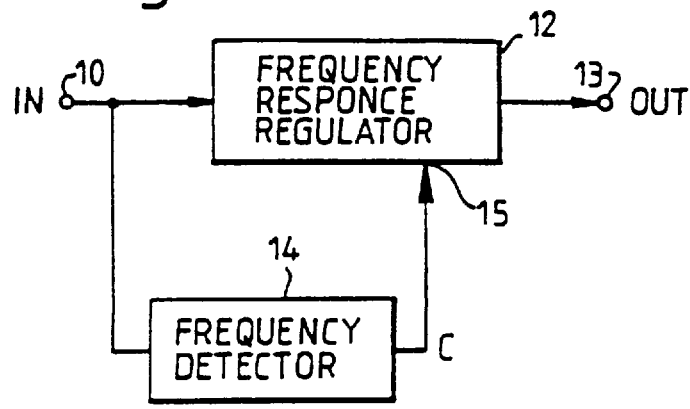
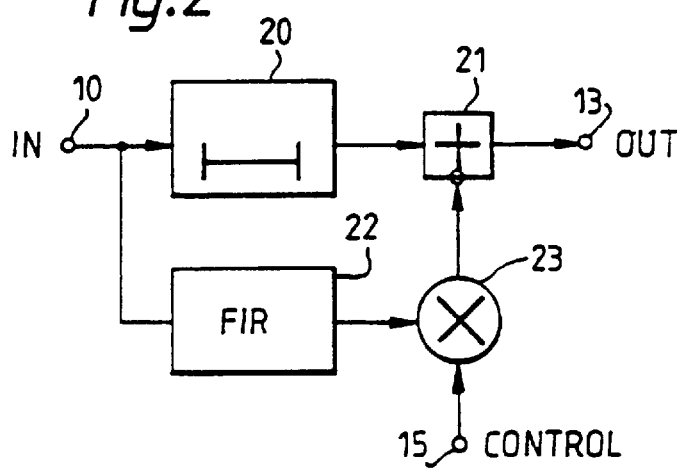
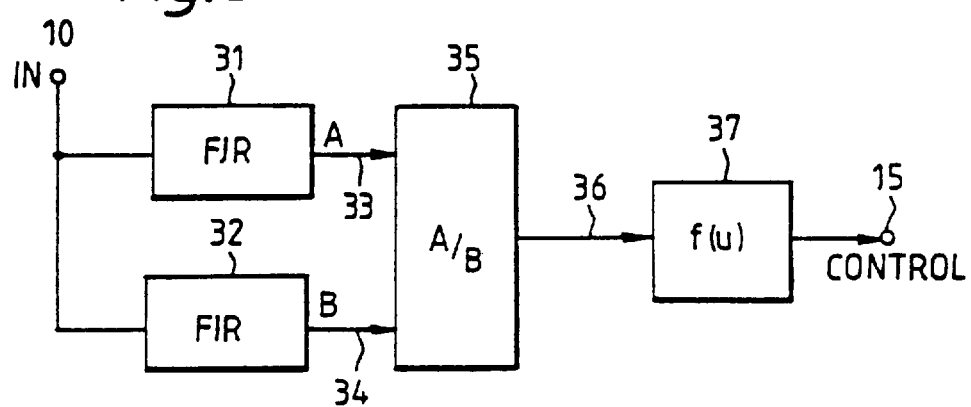

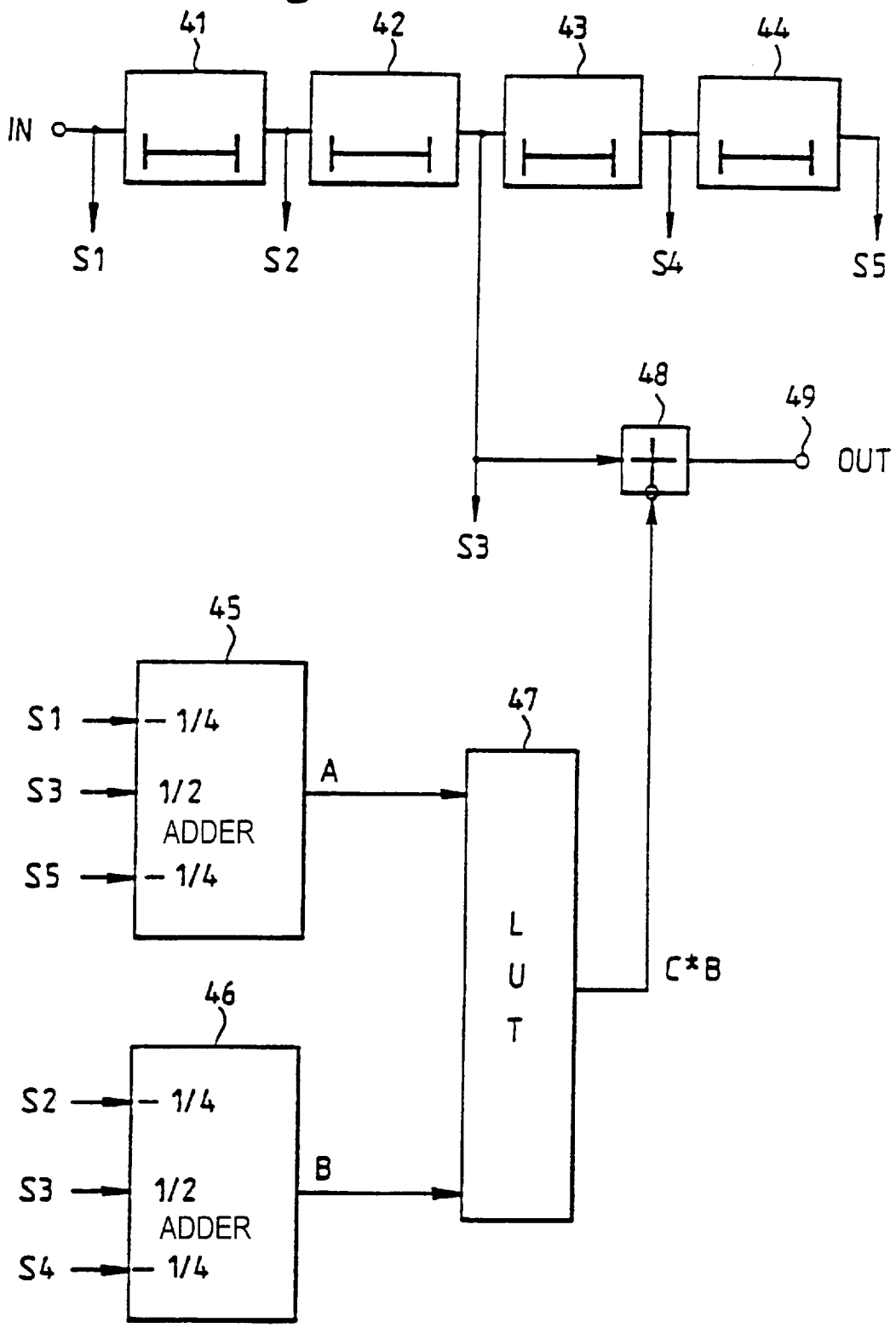

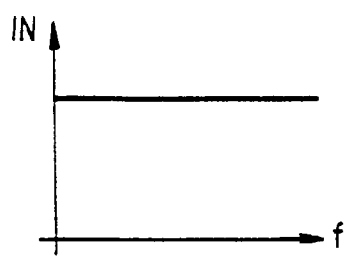
Fig 5(a)(1)
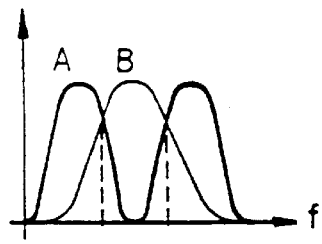
Fig 5(a)(2)
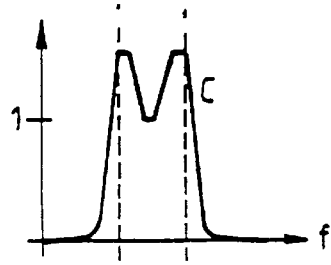
Fig 5(a)(3)
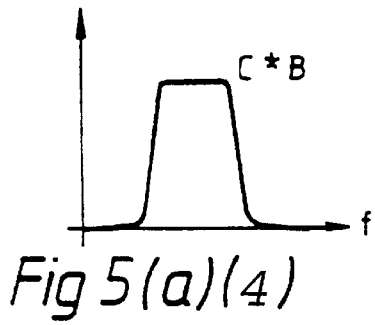
Fig 5(a)(4)
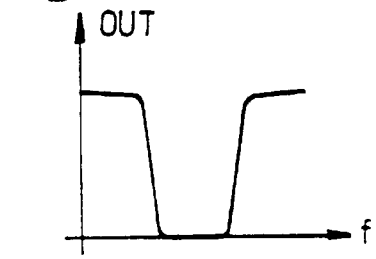
Fig 5(a)(5)
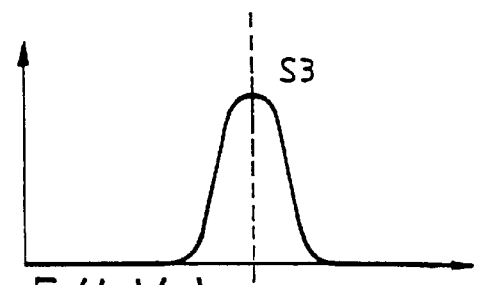
Fig 5(b)(1)
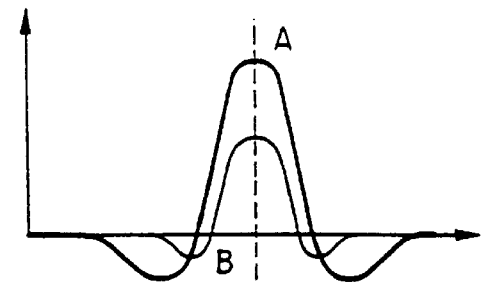
Fig 5(b)(2)
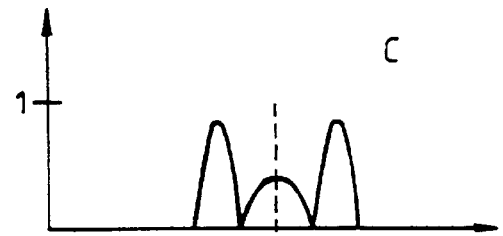
Fig 5(b)(3)
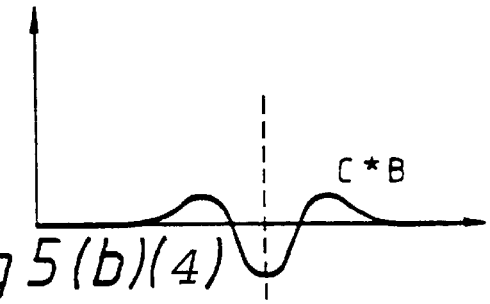
Fig 5(b)(4)
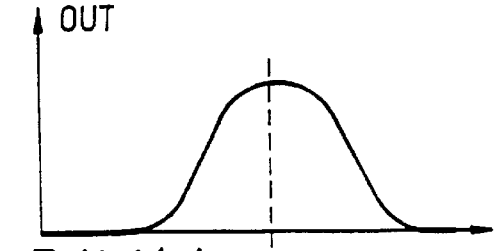
Fig 5(b)(5)

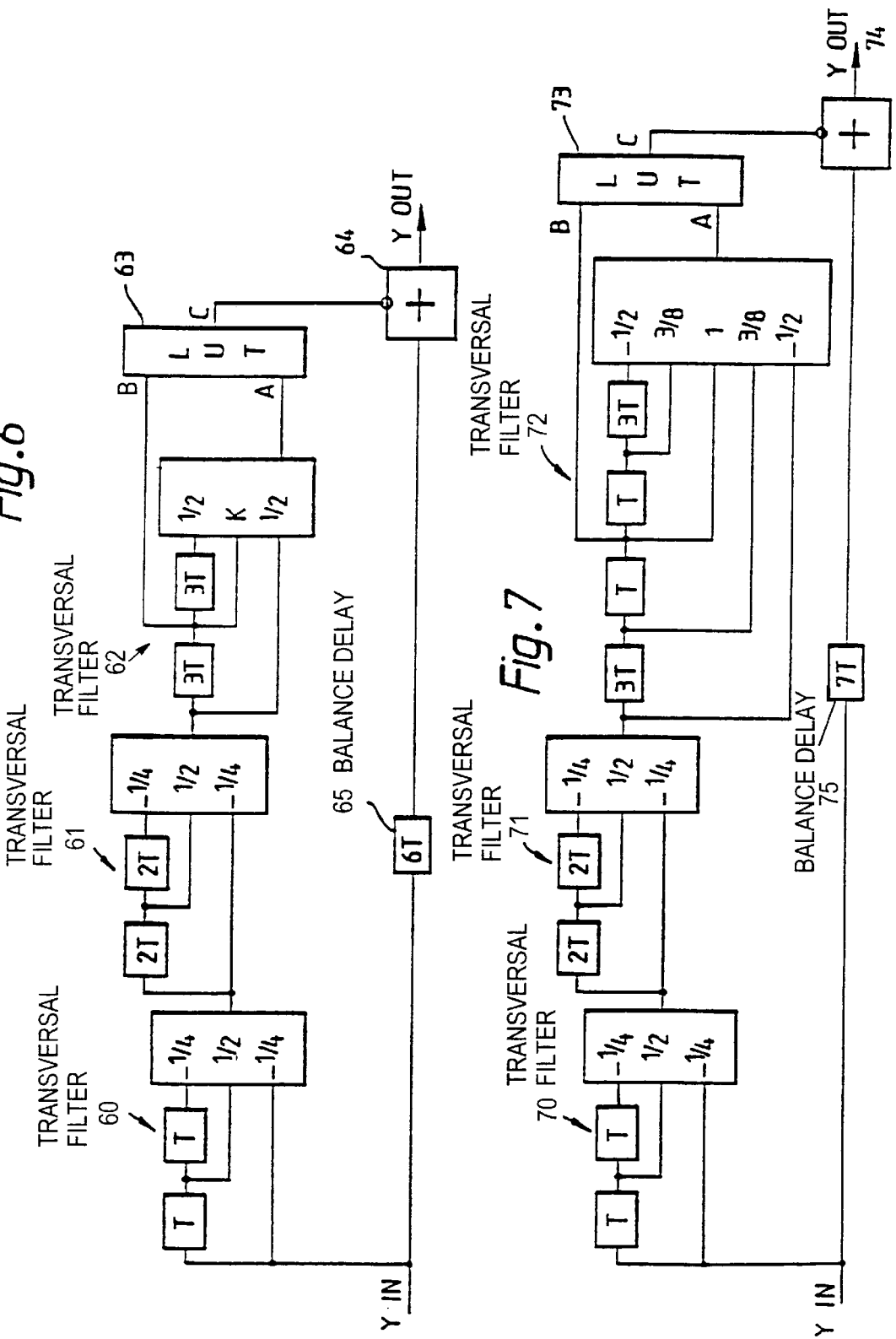

VIDEO SIGNAL PROCESSING AND PROCESSOR TAKING RATIO OF INTERMEDIATE FILTERED SIGNALS

This application is a continuation of application Ser. No. 08/360,712 filed Feb. 21, 1995, which is a 371 of PCT/GB 93/0-1236 filed Jun. 10, 1993.

This invention relates to the processing of analog or digital signals and is concerned in the most important example with filtering techniques.

A well known filtering technique involves calculation of the linear sum of several copies of the input signal shifted in time or space. These copies are then summed with appropriate weights using appropriate coefficient multipliers and adders. The frequency characteristic and pulse response of the resultant filter are linked by the well known Fourier transform. It is a fundamental limitation that, all other things being equal, narrowing the frequency bandwidth of the filter lengthens the pulse response, and vice versa. It is not generally possible to achieve simultaneously a narrow frequency bandwidth and a short pulse response.

In a variety of applications, particularly in video signal processing, it is often desirable to suppress or to extract a narrow band of the incoming signal frequency range without any significant signal delay and without the appearance of overshoots or ripples on the pulse response.

It is, therefore, an object of one aspect of the present invention to provide an improved method of filtering capable of combining both narrow band filtering and short, ripple-free pulse response.

It is another object of one aspect of the present invention to provide an improved filter which offers steep frequency response without placing unduly high demands on the complexity of the filter circuitry and without introducing untoward delay in the signal path.

Accordingly, the present invention consists in one aspect in a method of filtering an input signal, comprising the steps of detecting the frequency of the input signal to provide a control signal and modifying the input signal in dependence upon the control signal.

Advantageously, the control signal is provided by conducting first and second filtering operations on the input signal to derive respective first and second intermediate signals and comparing said intermediate signals to derive the control signal.

Preferably, a ratio of the first and second intermediate signals is taken to derive the control signal, more preferably, in a manner which is level independent.

In another aspect, the present invention consists in a signal filter comprising a signal modification channel containing frequency response regulator means and a parallel channel containing frequency detection means serving to detect the frequency of an incoming signal and to control the response of the frequency response regulator means in dependence thereon.

Advantageously, the frequency detection means comprises first and second, different filters and means for deriving a control signal as a function of the respective filter outputs.

Preferably, the means for deriving a control signal serves to derive a ratio between the respective first and second filter responses.

Suitably, the control signal is a non-linear function of said ratio, possibly independent of sign.

The separation, according to aspects of this invention, of the two functions of detecting frequency and modifying the amplitude or phase of an input signal (which functions are combined in conventional filters) introduces considerable flexibility in filter design.

The manner in which a control signal is derived—according to a preferred form of this invention—by calculating the ratio of the output signals of two different conventional filters is particularly important. The resulting control signal may be a linear or non-linear function of the ratio and the complete filter may be termed "logometric". Since a logometric filter involves division rather than the addition operation of corresponding filters, it is able to combine narrow bandwidth or steep frequency response (or both) with short and accurate pulse response.

It should further be noted that a logometric filter takes into account not only the level of the suppressed or extracted component of signal spectrum, but also the relationship with other spectrum components. In contrast, a conventional filter supply ignores those parts of the spectrum outside the band or region of interest. For example, in the case of a low pass filter with an almost rectangular frequency response, the output of a conventional filter is completely independent of the shape of the high frequency signal component; a logometric filter according to this invention may be affected by this shape. This is advantageous, for example, when considering the response to a 2T sine squared pulse input. Preserving some high frequency information maintains the shape of the pulse.

Both analogue and digital implementations of logometric filters are possible but in the area of high speed decision of two signals, digital implementations will often be preferred. A look-up table arrangement offers particular advantage especially when a single look-up table combines the division function with the other non-linear functions in the complete filter. In this manner a filter can be produced according to this invention having the above-mentioned advantages yet with a structure which is more economic than that of a corresponding conventional filter.

The invention will now be described by way of examples with reference to the accompanying drawings, in which:

FIG. 1 is a block diagram of a filter according to one aspect of the present invention;

FIG. 2 is a more detailed block diagram of a frequency response regulator component of the filter system in FIG. 1;

FIG. 3 is a more detailed block diagram of a frequency sensor component of the filter shown in FIG. 1;

FIG. 4 is a circuit diagram of one digital embodiment of the filter illustrated in FIGS. 1, 2 and 3;

Figure 8:
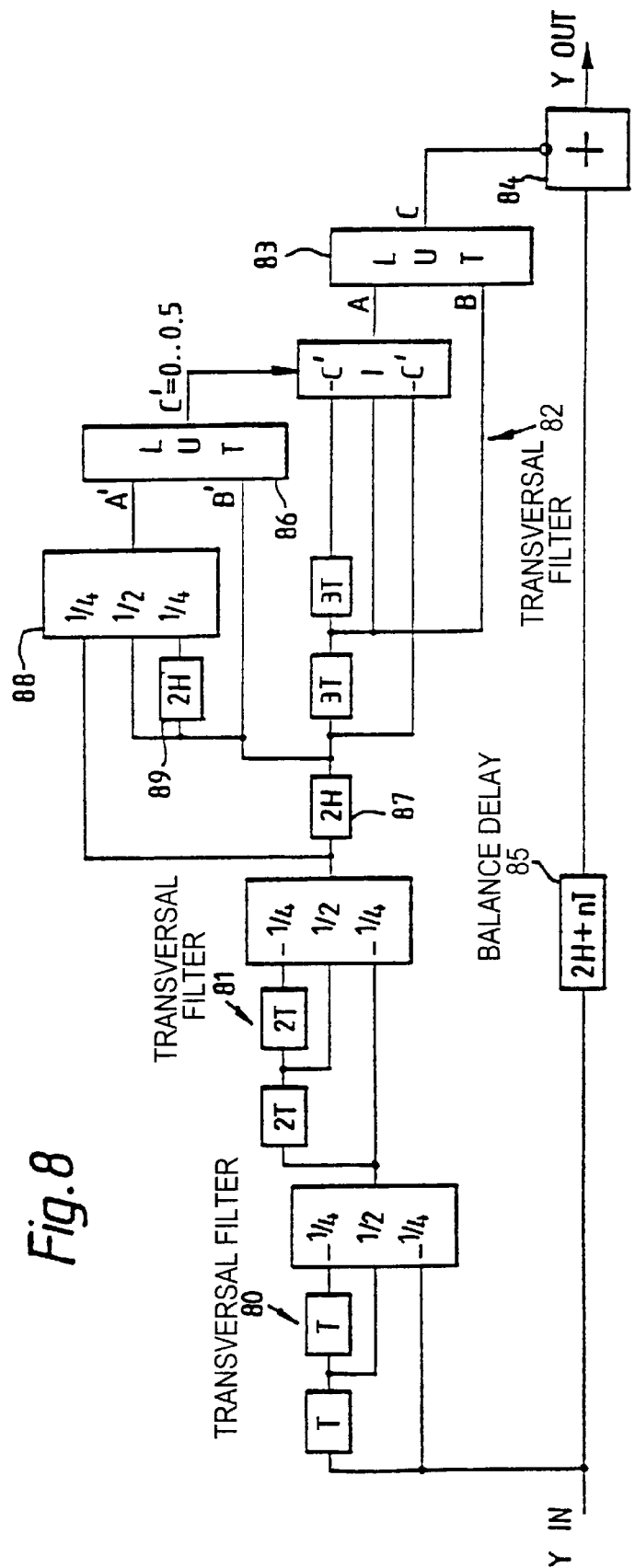
Figure 9:
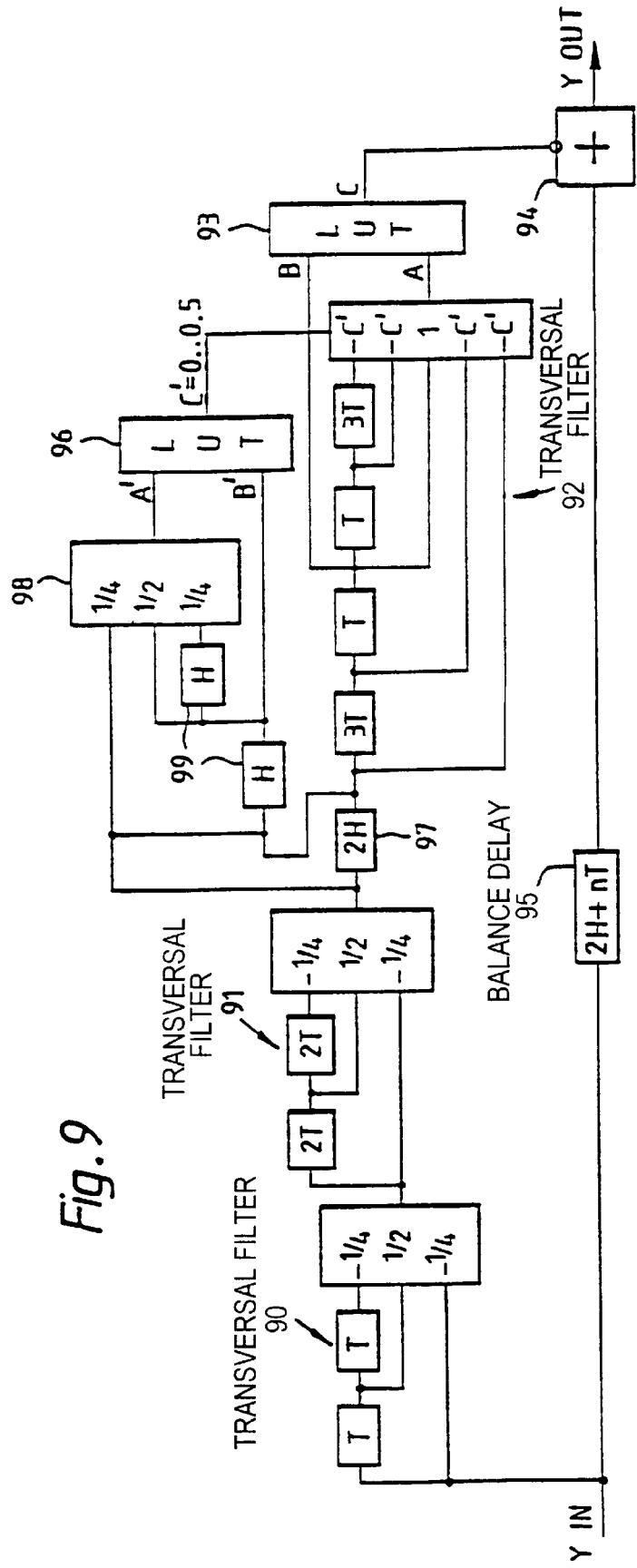
Figure 10:
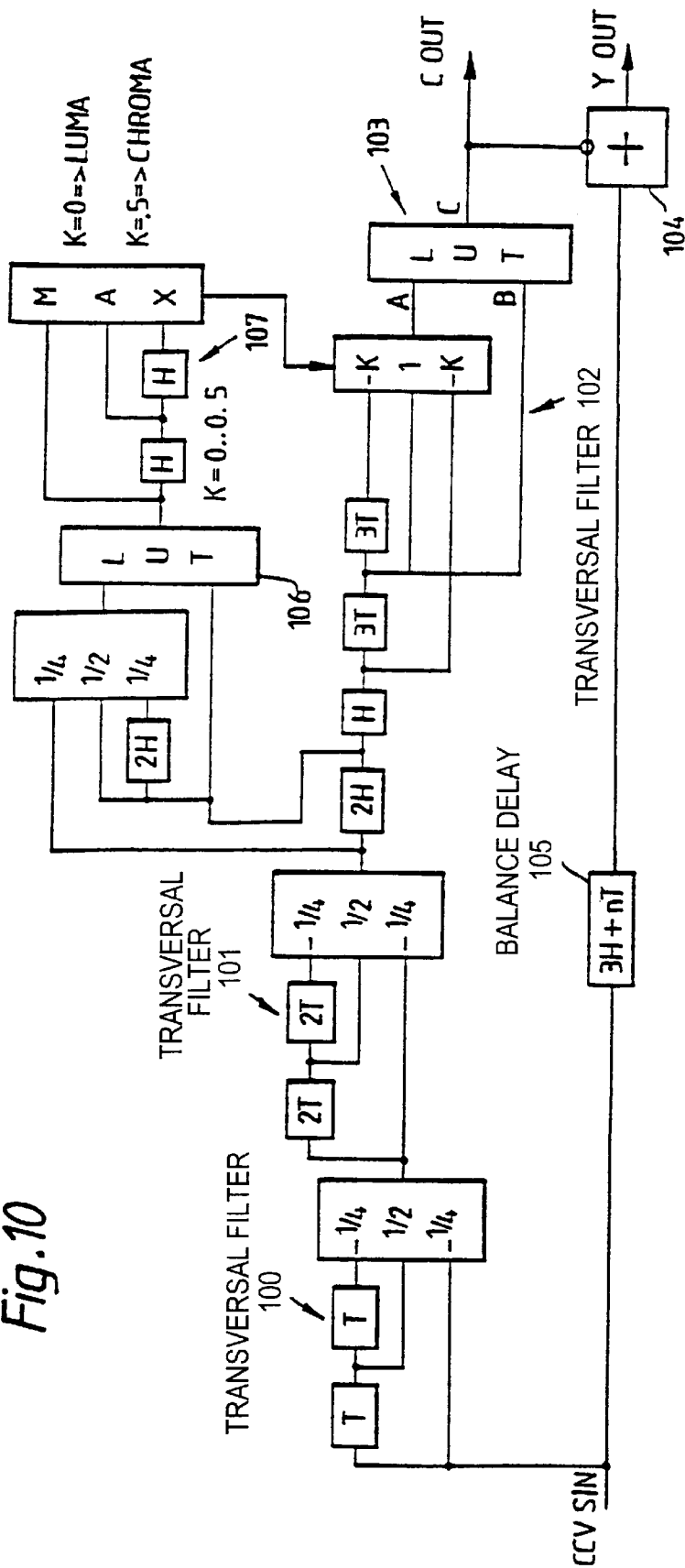
Figure 11:
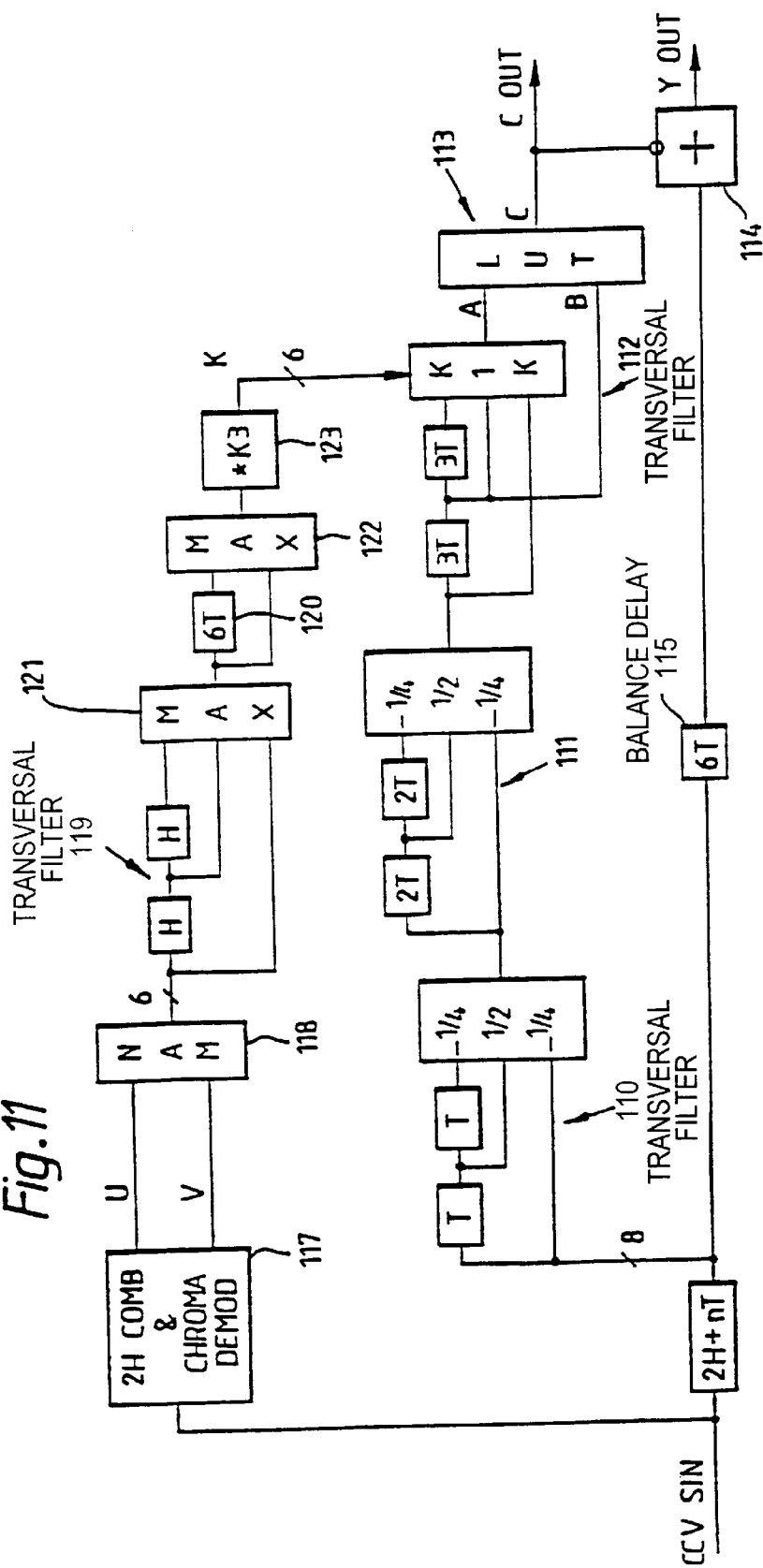
Figure 12:
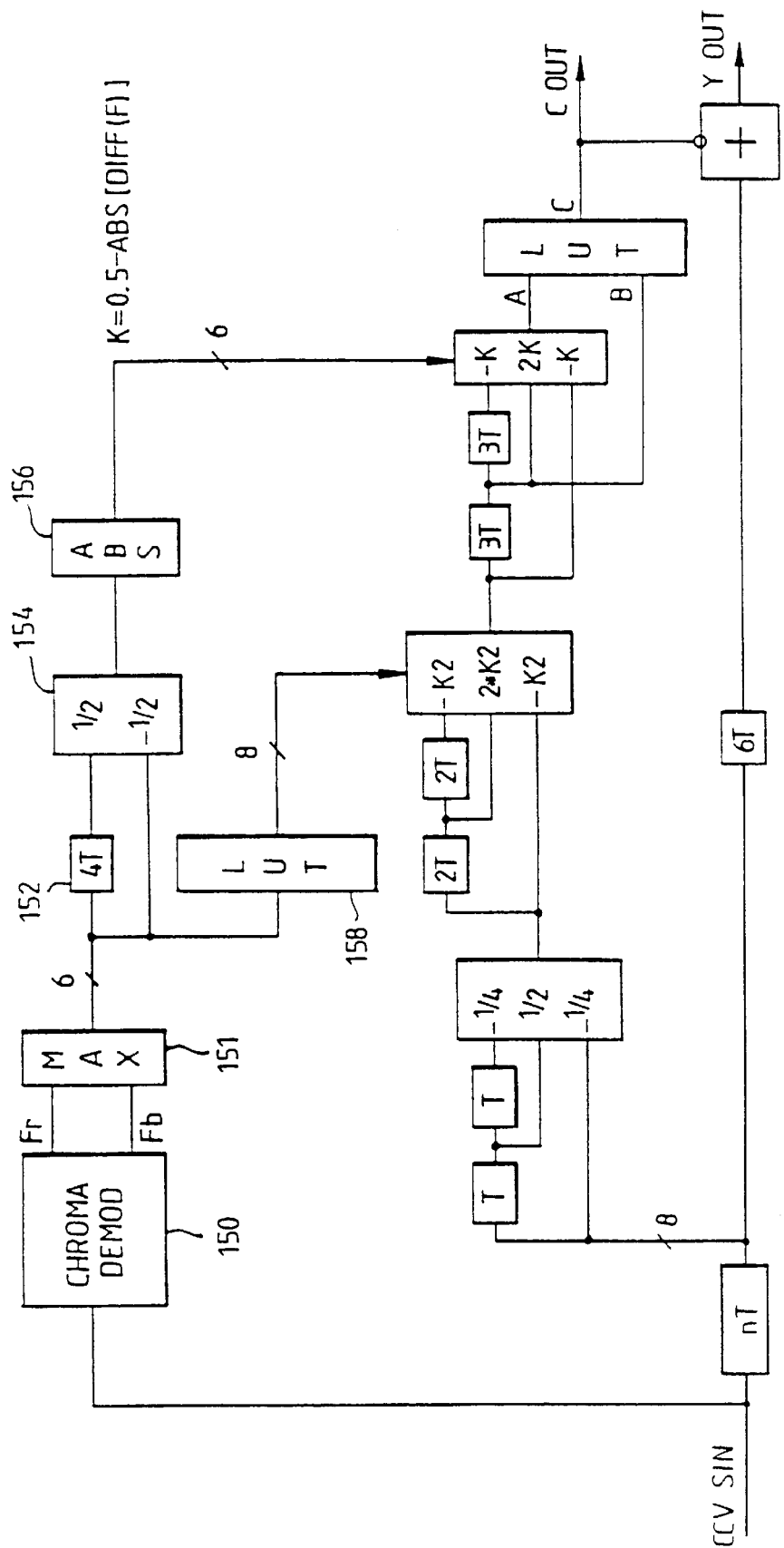

FIGS. 5(a)–5(b) are a family of plots illustrating at FIG. 5 a) the frequency responses and at FIG. 5b) the pulse responses at significant points in the filter circuit of FIG. 4;

FIG. 6 illustrates a luminance pre-filter for use in a PAL or SECAM decoder;

FIG. 7 illustrates a modified luminance pre-filter for use in a NTSC decoder;

FIG. 8 illustrates a two-dimensional variation of the circuit shown in FIG. 6;

FIG. 9 illustrates a two-dimensional variation of the circuit shown in FIG. 7;

FIG. 10 illustrates a PAL chrominance separator for a decoder, analoguos to the filter of FIG. 8 but including comb breakdown detection;

FIG. 11 illustrates a PAL decoder similar to FIG. 10 with a further modification;

FIG. 12 illustrates a SECAM decoder.

Referring initially to FIG. 1, a signal at the input terminal (10) passes through the frequency response regulator (12) to the output terminal (13) and simultaneously the current frequency of this signal is evaluated by the frequency detector (14). The resulting frequency-dependent signal C from the output of the detector (14) controls the parameters of the frequency response regulator (12) changing the overall response of the filter in the desirable manner. For instance, if the sensor (14) is adjusted to give maximal value of a signal C in the frequency band from F1 to F2 and the minimal value for other frequencies, the overall frequency response of the filter could be band-pass in F1–F2 band or band-stop in the same band depending on the polarity of the control input (15) of the regulator (12).

Referring now to FIG. 2, there will be described in more detail one preferred form of the regulator (12) shown in block form on FIG. 1. The input signal from the terminal (10) passes through the compensating delay line (20) and the adder (21) to the output (13) and simultaneously through the filter (22) and the multiplier (23) to the second input of the adder (21). The control signal C at the terminal (15) influences the amount of filtered signal added to the input signal with the result of the frequency response from the input terminal (10) to the output terminal (13).

Referring now to FIG. 3, there will be described in more detail one preferred form of the frequency detector (14) shown in block form on FIG. 1. The input signal from the terminal (10) passes through two filters (31) and (32) to the inputs (33) and (34) of the divider (35) providing at its output (36) a signal proportional to the ratio of the absolute values of two filtered signals A and B presented at the divider's inputs. To avoid uncertainty in the case of signal B (denominator) being close to zero the output signal of the divider (35) is set equal to a default value if the input signal B is below a predetermined threshold. By choosing the frequency responses of the filters (31) and (32) it is possible to provide a logometric (level independent) signal which varies according only to the current frequency of the input sinusoid at the terminal (36).

The control signal provided at the output (36) of the divider (35) could be used directly to control the frequency response of the regulator (12) in FIG. 1. But to reduce the complexity of the filters used and to ensure shorter delay of the processed signal, the control signal is first modified in non-linear device (37) to achieve the necessary relationship between the mentioned ratio and the desirable value at the control input of the regulator. Thus the shape of overall frequency response is no longer determined solely by the weighted sum of a number of delayed copies of an input signal but also by the shape of the non-linear amplitude transfer function of the lag-free devices (35) and (37). This feature defines a critical difference between the nature and performance of the logometric filter and of the conventional filters.

In the case of digital implementation shown in FIG. 4 the input signal passes through four identical delay lines (41, 42, 43 and 44). Five signals S1, S2, S3, S4 and S5 taken from these delay lines are combined in two adders (45) and (46) providing two filtered signals A and B. The look-up table device (47) combines the functions of blocks (35) and (37) shown in FIG. 3 with the function of multiplier (23) shown in FIG. 2. Adder (46) together with delay lines (41–44) fulfils the functions of the filter (22) shown in FIG. 2. Obviously, such a-design is very economical in terms of components needed. The output of the look-up table is combined with the central tap signal S3 in the adder (48) thus providing a filtered output at the terminal (49).

Referring now to FIG. 5(a), the circuit of FIG. 4 can be understood to work as follows in terms of sinusoidal signals.

The plots i) to v) all show level against frequency with the input signal shown at plot i).

Both A and B signals—as seen in plot ii)—are in-phase sinusoids with the ratio of amplitudes defined by the frequency of the input signal. Inside the look-up table 47 the ratio is used to produce the control signal C, shown in plot iii). Then (also inside the look-up table) the signal B is multiplied by the virtual control signal C. The output signal of the look-up table presents a sinusoid in phase with the central tap signal S3, the amplitude of this sinusoid signal is nearly constant within the predetermined frequency band and decreases rapidly outside its range, as seen in plot iv). Therefore, the output signal shown in plot v) does not contain the components within this band because they are cancelled in the adder (48).

In terms of pulse response the circuit of FIG. 4 works as follows, referring to FIG. 5(b):

The signals A and B can be seen from plot ii) to have the same shape as a second difference of the central tap signal S3 of plot (i), but the width and the peak to peak amplitudes of these signals differ. When the absolute value of the signal A exceeds the absolute value of the signal B the control signal C shown in plot (iii) drops to low level causing the signal at the look-up table output shown in plot (iv) to drop as well. As a result the height and the width of the C*B signal decrease. Thus, the filter pulse response is higher than the response of a FIR filter with three taps and equivalent bandwidth and much shorter than the responses of multi-tap FIR filter with comparable steepness of frequency response.

It is important to note that the central frequency, bandwidth, depth and even shape of the frequency response of a filter of this type can be easily controlled by changing the look-up table content.

Filters and signal processing arrangements according to this invention will have many applications, particularly in the video field. Thus, in one simple example, setting the delay time of the delay lines (41–44) in FIG. 4 equal to the duration of a TV line results in an economical and efficient vertical LPF appropriate for instance for reduction of inter-line flicker.

A particularly important application of this invention lies in the encoding and decoding of video signals involving the separation of chrominance information. Generally speaking, replacing a conventional notch filter with a band stop filter according to this invention will significantly increase the design options without materially increasing (and sometimes decreasing) the circuit complexity.

There will now be described a series of embodiments of encoder or decoder arrangements or components, operating variously in the PAL, NTSC and SECAM broadcast standards.

Referring now to FIG. 6, there is shown a circuit for use in the luminance channel of a PAL/SECAM encoder to remove luminance components likely to give rise to chrominance cross-talk.

The digital system is intended to operate at a sampling rate of 13.5 MHz and consists of two transversal filters (60, 61) providing a band pass response approximately from 3 to 5 MHz. A third transversal filter (62) together with a look-up table (63) provide a notch filter according to this invention having a notch response with peaks at 2.25 and 6.75 MHz and zero response at 4.5 MHz. Luminance information in the 3 to 5 MHz band which passes through the notch filter (and is therefore likely to give rise to chrominance cross-talk) is removed from the main luminance channel of subtracter (64). A balancing delay (65) completes the circuit.

The algorithm implemented within look-up table (63) is illustrated below:

TABLE I

| If abs(B)>1/28 then:- |
| --- |
| If abs (A/B)>Th then:- |
| If 1−(abs(A/B)−Th)*$k_1$>0 then:- |
| C:= $k_2$*(1−(abs(A/B)−Th)*$k_1$)*B |
| else C:= 0 |
| else C:= $k_2$*B |
| else C:= 0 |

| Where:- | Value for PAL | Value for SECAM | Value for NTSC |
| --- | --- | --- | --- |
| K | 1 | 0.875 | N/A |
| Th | 0.06 | 0.06 | 0.1 |
| $K_1$ | 2.5 | 2.5 | 1.5 |
| $K_2$ | 1.5 | 1.6 | 1.5 |

It will be recognised that when the signal A (being the output of the transversal filter (62)) is substantially smaller than the signal B from the output of the band pass filter consisting of filters (60) and (61), the output C from the look-up table (63) is a scaled copy of the signal B. The gains and delays in the two paths are adjusted to give total cancellation of the incoming signal at the output of the subtracter (64). If the frequency of the signal A is relatively far from the zero point of the notch, (as seen most clearly in plot (ii) of FIG. 5(a) the amplitude rises and the absolute value of the ratio A/B becomes closer to unity. The appropriate choice of the threshold value (Th) and the coefficient $k_1$, $k_2$ permits a wide variety of frequency responses to be tailored with the appropriate width and depth of the notch. A fundamental advantage of the present invention is the ability to avoid distortion of wide band signals, in particularly the distortion of 2T sine squared pulses. With such input signals, the shapes of signals A and B correlate in such a way as to give small and symmetrical overshoots but no reduction in the overall pulse height or extended ringing.

The flexibility of the look-up table approach permits further compensation to be provided where the signal B departs from the rectangular band passed or other desired form.

FIG. 7 shows the variations required for an NTSC approach. It will be seen that this differs in the detail of the transverse filter (72) which has an additional two taps and provides zero gain frequency position which is close to 3.5 MHz. The values of the parameters Th, $k_1$ and $k_2$, are again shown in TABLE I. There is a necessary increase in the compensating delay (75).

Similar principles can be applied in two dimensional filtering of video signals for encoding and decoding.

FIG. 8 illustrates a two dimensional dynamic trap for a PAL encoder. Components (80–85) correspond generally with those of the one dimensional arrangement of FIG. 6 except that the coefficients of the transversal filter (82) are not. fixed. In this variation, the gain of the notch filter is not permanently zero at the characteristic frequency 4.5 MHz but in fact depends upon the control signal C' from a further look-up table (86) addressed by signals A' and B'. The signal B' is simply a copy of the band pass filtered signal delayed by two lines at (87). The signal A' is produced by a comb filter comprising an adder (88) and the appropriate line delays (87, 89).

The algorithm employed in the look-up table (86) to derive control signal C' from signal A' and B' is analogous to that shown in Table I for signals A, B and C. The control signal is confined to the region 0<C'<0.5.

It will be seen that the signal A' is equal to zero at the PAL spatial frequencies corresponding with chrominance. In this case the control signal C' is equal to 0.5 with the result that the chrominance detector has maximum sensitivity. When the signal C' decreases, the response of the chrominance detector becomes more flat and at C'=0, the response is totally flat so that the system output is merely a delayed copy of the input.

It is important to note that the sign of the signals A' and B' has no influence on the result. This makes it possible to achieve two-lobes of vertical response with only three taps in the 2H comb. Thus, the 45° luminance diagonals are not detected and attenuated by the system.

FIG. 9 shows a variant for an NTSC system differing as before in the detail of FIR (92) defining the notch centre-point and also showing the necessary delays (99) in the comb filter.

It will be understood that the above described arrangements for removing potential chrominance cross-talk in the luminance pre-filter of an encoder are analoguos with chrominance separators in decoders. Simply replacing the luminance input with a composite input will provide a decoder luminance output and—at the negative input to the subtracter (64, 74, 84) or (94)—a chrominance output.

In "normal" operation, the output from the look-up table (83) of FIG. 8 and look-up table (93) of FIG. 9 is a "clean" chrominance (or pseudo-chrominance) signal which on being subtracted from the input gives a "clean" luminance signal. However, this configuration has a disadvantage common to all linear comb detectors that it fails dramatically at a vertical transition between saturated colours, producing the so-called "hanging dots" pattern.

A modification to avoid this comb breakdown is illustrated in FIG. 10 which is the decoder configuration. In this modification, the output of the look-up table (106) is additionally processed by vertical filter (107) which takes the form of two 1H delay units and a non-additive mixer. In this case the filter is adapted to select the maximum for three inputs. As a result, the control signal C' remains at the appropriate level, even when the comb filter fails. This is achieved because a comb filter fails at no more than two lines in sequence. Above and/or below a failure area, a comb filter will successfully detect saturated colour. There is a drawback in this solution that there is a reduction in the diagonal luminance resolution not only at the saturated colour region but at an area extended by 2H.

An alternative solution uses chrominance demodulator output signals to evaluate the presence and the saturation of colour information. Referring to FIG. 11, there is shown a 2H comb and chroma demodulator (117) providing U and V outputs which are taken to a non-additive mixer (118). This provides an output which is the maximum of the absolute U and V values. This signal is further processed by a two dimensional non-additive mixer consisting of two 1H delay units (119), a horizontal delay unit (120) and two non-additive mixers (121) and (122). A scaler unit (123) serves to provide appropriate overall control the channel gain. The separated "clean" chrominance signal from the output of look-up table (113) can be used for improved chrominance demodulation. As this has not been filtered vertically, the signal conserves full vertical colour resolution.

In the SECAM mode of operation, some additional processing is desirable for improved signal separation. Whilst it is possible to use vertical filtering, the results are not as good as in PAL and NTSC systems. A modification will now be described with reference to FIG. 12.

Here, the demodulated signal proportional to the current FM sequence chrominance frequency from demodulator and non-additive mixer (151) (implementing the function max (abs($F_b$)), (abs($F_r$))) is used as the input for a control chain consisting of a delay unit (152), a subtracter (154) and an absolute function unit (156). In this way, the control signal K is related proportionally to the absolute value of the first derivative of the demodulator signal. It is thus provided that at transients between saturated colours, the sensitivity of the chrominance detector increases, giving a broader trap and a smaller amplitude of residual chrominance signal in the output luminance signal. Similarly, in the non-saturated (monochrome) areas any spectral component of the composite SECAM signals significantly different from the sub-carrier frequency is preserved because of the narrow bandwidth of the rejection determined by high gain in the A channel.

An auxiliary look-up table (158) serves to provide the signal which is necessary for fine adjustment of a system calculation frequency. This is not of course necessary for NTSC and PAL systems where the chrominance frequency is constant. This serves to vary the parameter $k_2$ in the range $1.6 < k_2 < 1.85$.

It should be understood that this invention has been described by way of examples only and a wide variety of modifications are possible without departing from the scope of the invention. Whilst the examples have been selected from the field of video signal processing, the invention is not limited in this regard and the filtering techniques described and claimed herein will have wide application in fields including audio, communication, data processing and image processing. In communications, for example, there is often a requirement to extract or suppress one particular frequency component. This is a task which the present invention is able to perform accurately and efficiently.

I claim:

1. A method of filtering an input video signal, comprising the steps of:

conducting first and second filtering operations on the input: signal to derive respective first and second intermediate signals;

taking a ratio of said intermediate signals to derive a control signal; and modifying the frequency spectrum of the input signal in dependence upon the control signal.

2. A method according to claim 1, wherein the input signal is modified using a look-up table having the input signal and control signal as respective address portion.

3. A method of video signal processing wherein a plurality of different filtering operations are conducted on an input signal to produce respective intermediate filtered signals, comprising the steps of:

deriving a control signal as an analytical function of the intermediate signals; and modifying the frequency spectrum of the input signal in dependence upon the control signal.

4. A method according to claim 3, wherein the control signal is a level independent of a level of the intermediate signals.

5. A method according to claim 3, wherein the control signal is a ratio between two intermediate signals.

6. A method according to claim 5, wherein the control signal is a non-linear function of said ratio.

7. A colour television signal processor for use in the separation of chrominance and luminance signals, comprising:

first filter means producing from an input a first filtered, signal;

signal modification means for modifying the first filtered, signal in dependence upon a control signal;

second filter means producing from the said input a second filtered signals; and control means serving to generate said control signal by taking a ratio of the first and second filtered signals.

8. A signal processor according to claim 7, wherein said control means comprises a look-up table.

9. A signal processor according to claim 8, wherein said look-up table functions additionally as said signal modification means.

10. A signal processor according to claim 7, wherein said first filter means comprises a band pass filter.

11. A method of processing a colour video signal comprising the steps of forming first and second signals representative of respective different in-phase measures of chrominance, deriving a control signal which is a non-linear function of the ratio of said first and second signals and forming the product of said control signal and said first signal.

12. A method according to claim 11, wherein said steps of deriving a control signal and forming a product are calculated using a common look-up table.

* * * * *

UNITED STATES PATENT AND TRADEMARK OFFICE
CERTIFICATE OF CORRECTION

PATENT NO. : 5,841,485
DATED : November 24, 1998
INVENTOR(S) : Avigdor STEINBERG It is certified that error appears in the above-identified patent and that said Letters Patent is hereby corrected as shown below:

On the cover page, under Related U.S. Application Data, change "1996" to --1995--

Signed and Sealed this

Twenty-seventh Day of April, 1999

Attest:

Q. TODD DICKINSON

*Attesting Officer*  Acting Commissioner of Patents and Trademarks